US006943582B1

(12) United States Patent
Andrews et al.

(10) Patent No.: US 6,943,582 B1
(45) Date of Patent: Sep. 13, 2005

(54) PROGRAMMABLE I/O STRUCTURE FOR FPGAS AND THE LIKE HAVING SHARED CIRCUITRY

(75) Inventors: William B. Andrews, Emmaus, PA (US); Mou C. Lin, High Bridge, NJ (US); John Schadt, Bethlehem, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 43 days.

(21) Appl. No.: 10/671,363

(22) Filed: Sep. 25, 2003

(51) Int. Cl.[7] .......................................... H03K 19/177
(52) U.S. Cl. ......................................... 326/41; 326/47
(58) Field of Search ............................. 326/38, 39, 40, 326/41, 47, 113

(56) References Cited

U.S. PATENT DOCUMENTS 5,821,776 A * 10/1998 McGowan ................... 326/41

OTHER PUBLICATIONS

U.S. Appl. No. 10/671,378, filed Sep. 25, 2003, Andrews et al.

* cited by examiner

Primary Examiner—Daniel Chang
(74) Attorney, Agent, or Firm—Steve Mendelsohn

(57) ABSTRACT

A programmable device such as a field-programmable gate array (FPGA) has programmable I/O circuitry. In one embodiment, a programmable I/O circuit (PIC) associated with at least first and second pads of the device has an output buffer that is selectively connected to the first and second pads via corresponding first and second transmission gates. The transmission gates enable an outgoing signal from the output buffer to be individually and selectively presented at the pads, while reducing the capacitive loading at each pad when the corresponding transmission gate is open (i.e., when the outgoing signal is not to be presented at that pad).

34 Claims, 7 Drawing Sheets

PROGRAMMABLE I/O STRUCTURE FOR FPGAS AND THE LIKE HAVING SHARED CIRCUITRY

CROSS-REFERENCE TO RELATED APPLICATIONS

The subject matter of this application is related to U.S. patent application Ser. No. 10/671,378 filed on the same date as the present application, the teachings of which are incorporated herein by reference.

TECHNICAL FIELD

The present invention relates to programmable devices, such as field-programmable gate arrays (FPGAs), and, in particular, to the input/output (I/O) interfaces for such devices.

BACKGROUND

A field-programmable gate array is a programmable device typically having a logic core surrounded by a ring of input/output (I/O) buffers. As silicon technology migrates to smaller and smaller devices and as core logic densities increase, the ratio of core logic to I/O buffers increases. In general, however, the physical size of I/O buffers has not been shrinking as fast as the physical size of the core logic. One solution to this phenomenon has been to implement narrow, elongated I/O buffers around the periphery of newer devices. Unfortunately, this approach significantly increases the cost of the devices.

Another factor contributing to the relatively large size of I/O buffers is the trend towards providing I/O circuitry with multiple different types of buffers connected to individual pads, for example, in order to support multiple different signaling applications. Unfortunately, this increased amount of circuitry results in increased levels of capacitance as seen from the pads, which increased capacitance adversely affects the higher-performance signaling applications.

SUMMARY

Problems in the prior art are addressed in accordance with the principles of the present invention by implementing programmable I/O buffers with circuitry that is shared by multiple pads. In that case, certain subsets of the circuitry that are not currently being used for one pad can be simultaneously used for another pad, thereby increasing the efficiency of use of the available I/O circuitry. Moreover, by implementing the selectivity capability using transmission gates connected between the outputs of output buffers and the corresponding pads, the capacitive load at a pad is reduced when a particular output buffer is not being used to drive an outgoing signal to the pad by opening the corresponding transmission gate.

In one embodiment, the present invention is a programmable device having programmable input/output (I/O) circuitry and programmable logic connected to receive incoming signals from and provide outgoing signals to the I/O circuitry. The programmable device comprises a first pad, a second pad, and a programmable I/O circuit (PIC) associated with the first and second pad. The PIC comprises a first output buffer, a first switch, and a second switch. The first output buffer is adapted to selectively present a first outgoing signal at the first pad and adapted to selectively present the first outgoing signal at the second pad. The first switch is connected between the first pad and the first output buffer to selectively present the first outgoing signal at the first pad. The second switch connected between the second pad and the first output buffer to selectively present the first outgoing signal at the second pad.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

FPGA Architecture

Figure 1:
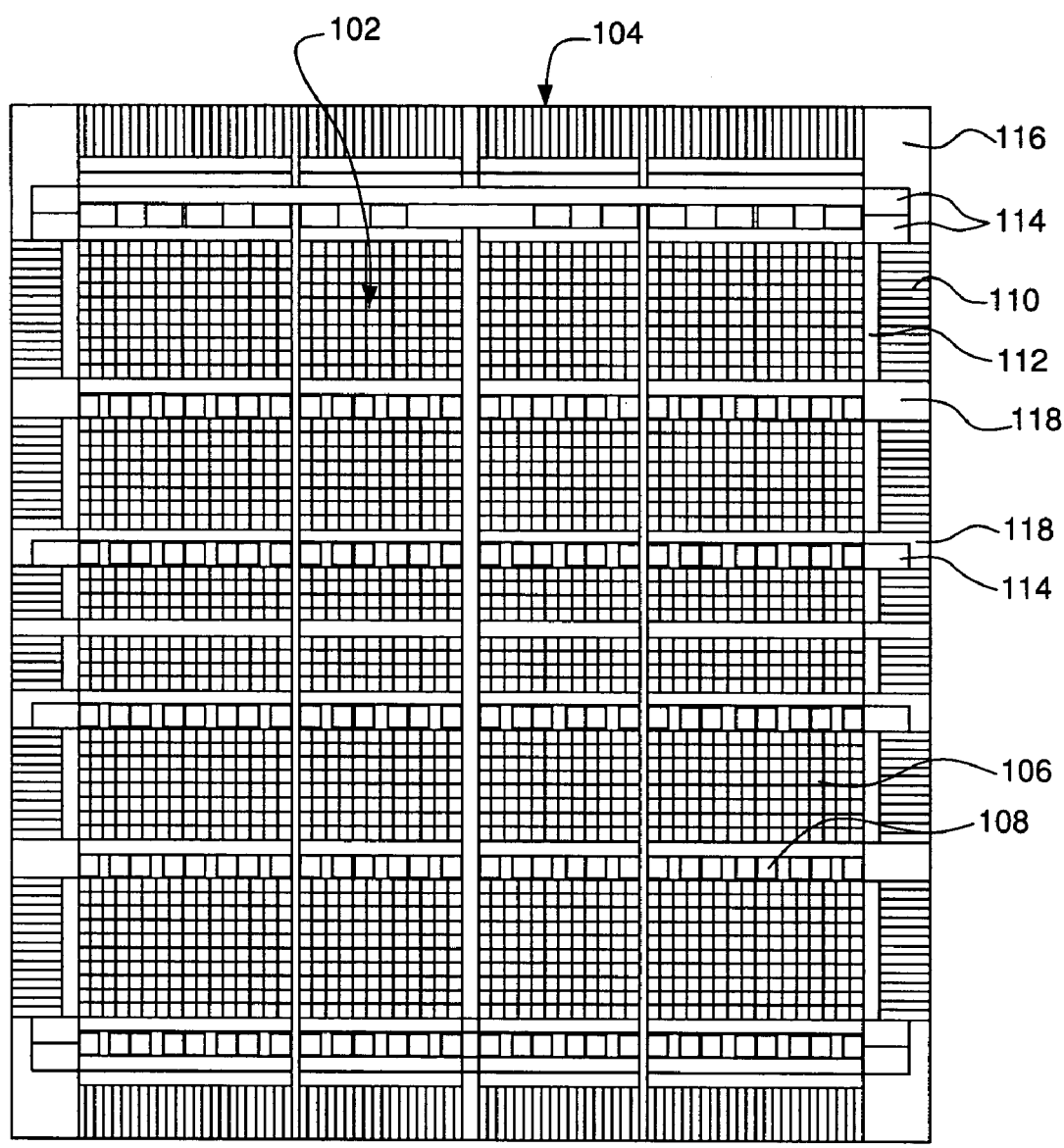
FIG. 1 shows a high-level block diagram of the layout of an exemplary FPGA of the present invention.

FIG. 1 shows a high-level block diagram of the layout of an exemplary FPGA 100 of the present invention, having a logic core 102 surrounded by an input/output (I/O) ring 104. Logic core 102 includes an array of programmable logic blocks (PLBs) 106 intersected by rows of block memory 108. Each PLB contains circuitry that can be programmed to perform a variety of different functions. The memory blocks in each row are available to store data to be input to the PLBs and/or data generated by the PLBs. I/O ring 104 includes sets of I/O buffers 110 programmably connected to the logic core by multiplexor/demultiplexor (mux/demux) circuits 112. The I/O buffers support external interfacing to FPGA 100. Also located within the I/O ring are a number of phase-locked loop (PLL) circuits 114 that are capable of providing different timing signals for use by the various elements within FPGA 100. Those skilled in the art will understand that FPGAs, such as FPGA 100, will typically include other elements, such as configuration memory, that are not shown in the high-level block diagram of FIG. 1. In addition, general routing resources, including clocks, buses, general-purpose routing, high-speed routing, etc. (also not shown in FIG. 1), are provided throughout the FPGA layout to programmably interconnect the various elements within FPGA 100.

The layout of an FPGA, such as FPGA 100 of FIG. 1, comprises multiple instances of a limited number of different types of blocks of circuitry. For example, an I/O ring may contain a number of instances of the same basic block of circuitry repeated around the periphery of the device. In the example of FPGA 100, I/O ring 104 is made up of multiple instances of the same basic programmable I/O circuit (PIC), where each PIC provides a particular number (e.g., three) of the I/O buffers of the I/O ring.

Exemplary Programmable I/O Buffers

Figure 2:
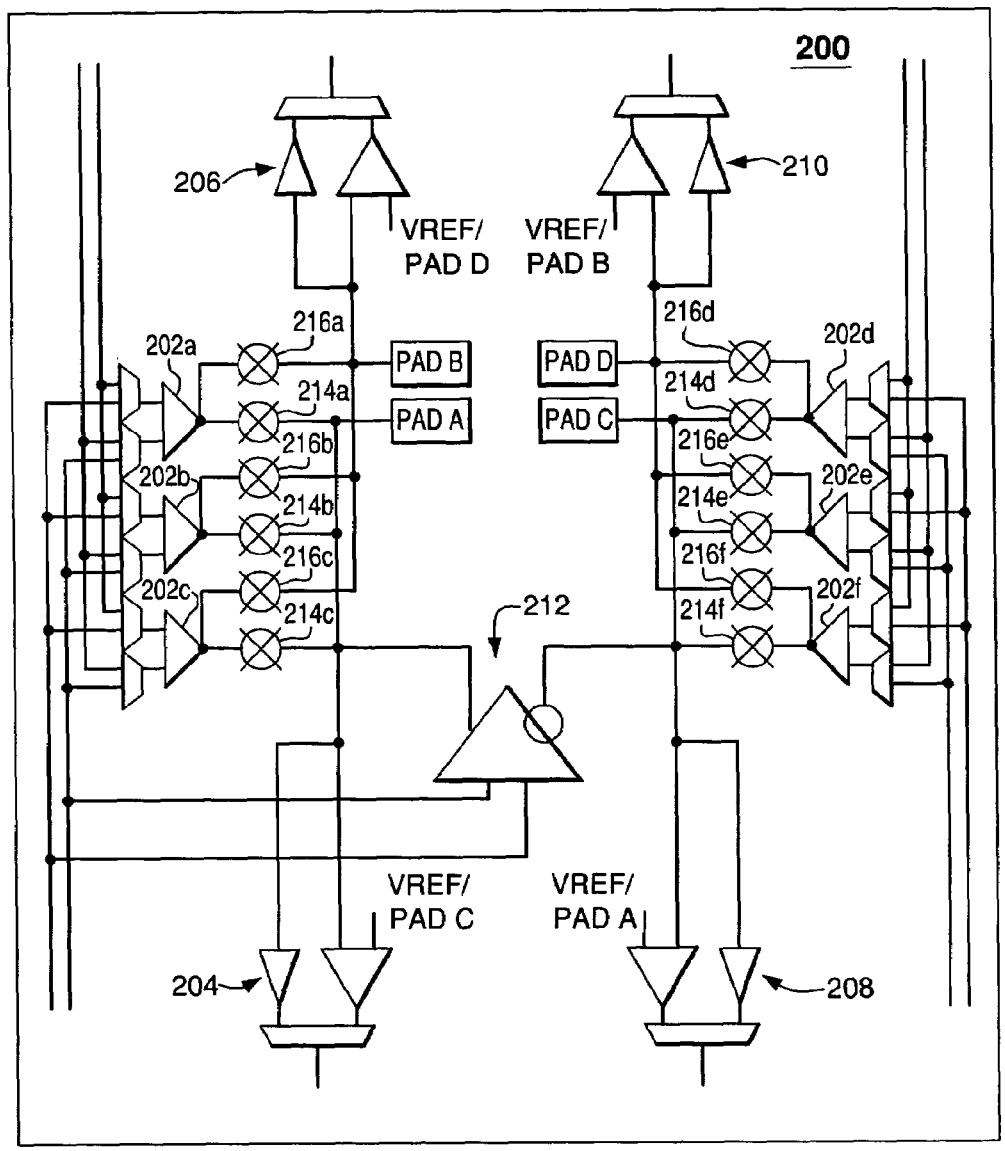
FIGS. 2–4 show schematic diagrams of programmable I/O buffers (PIBs) for the FPGA of FIG. 1, according to three different embodiments of the present invention.

FIG. 2 shows a schematic diagram of a programmable I/O buffer (PIB) 200 for FPGA 100 of FIG. 1, according to one embodiment of the present invention. As shown in FIG. 2, PIB 200 provides I/O circuitry associated with four I/O silicon pads A–D. In particular, PIB 200 has six push-pull output buffers 202, four input receivers 204–210, and a differential output buffer 212, variously connected between pads A–D and other internal FPGA circuitry (not shown).

More particularly, input receiver 204 is connected to receive incoming signals from pad A, input 30 receiver 206 is connected to receive incoming signals from pad B, input receiver 208 is connected to receive incoming signals from pad C, and input receiver 210 is connected to receive incoming signals from pad D. In addition, the differential outputs from differential buffer 212 are connected to provide a differential outgoing signal to pads A and C. Furthermore, each of output buffers 202a–c is connected to provide an outgoing signal to pads A and B via a corresponding pair of transmission gates 214 and 216, respectively. Similarly, each output buffer 202d–f is connected to provide an outgoing signal to pads C and D via a corresponding pair of transmission gates 214 and 216, respectively. In a preferred implementation, each transmission gate 214, 216 is independently controllable to be either on (closed) or off (open).

The circuitry of PIB 200 of FIG. 2 enables the four pads A–D to support a wide range of different operational modes. In theory, different possible modes of operation can be implemented from different combinations of the following capabilities for the four different pads A–D:

Pad A
 Incoming signal drives input receiver 204;
 Differential buffer 212 drives half of differential outgoing signal; and/or
 Any combination of one or more output buffers 202a–c drives "combined" outgoing signal.
Pad B
 Incoming signal drives input receiver 206; and/or
 Any combination of one or more output buffers 202a–c drives "combined" outgoing signal.
Pad C
 Incoming signal drives input receiver 208;
 Differential buffer 212 drives other half of differential outgoing signal; and/or
 Any combination of one or more output buffers 202d–f drives "combined" outgoing signal.
Pad D
 Incoming signal drives input receiver 210; and/or
 Any combination of one or more output buffers 202d–f drives "combined" outgoing signal.

One of the advantages of the design of PIB 200 is the efficient use of circuitry. For example, although pad A can be simultaneously driven by all three output buffers 202a–c, if only a subset of those output buffers is used to drive pad A, the one or two "unused" output buffers can be simultaneously used to drive pad B, by appropriately setting the states of the corresponding transmission gates 214 and 216. Moreover, if one or more of output buffers 202a–c are used to drive pad B, pad A can be simultaneously operated in a differential output mode via differential output buffer 212 or in an input mode via input receiver 204. Thus, while circuitry is provided to enable pads A and C to be operated in a number of different input and output modes, certain subsets of that circuitry that are not currently used for pads A and C can be simultaneously used for pads B and D, thereby increasing the efficiency of use of the available circuitry.

Figure 3:
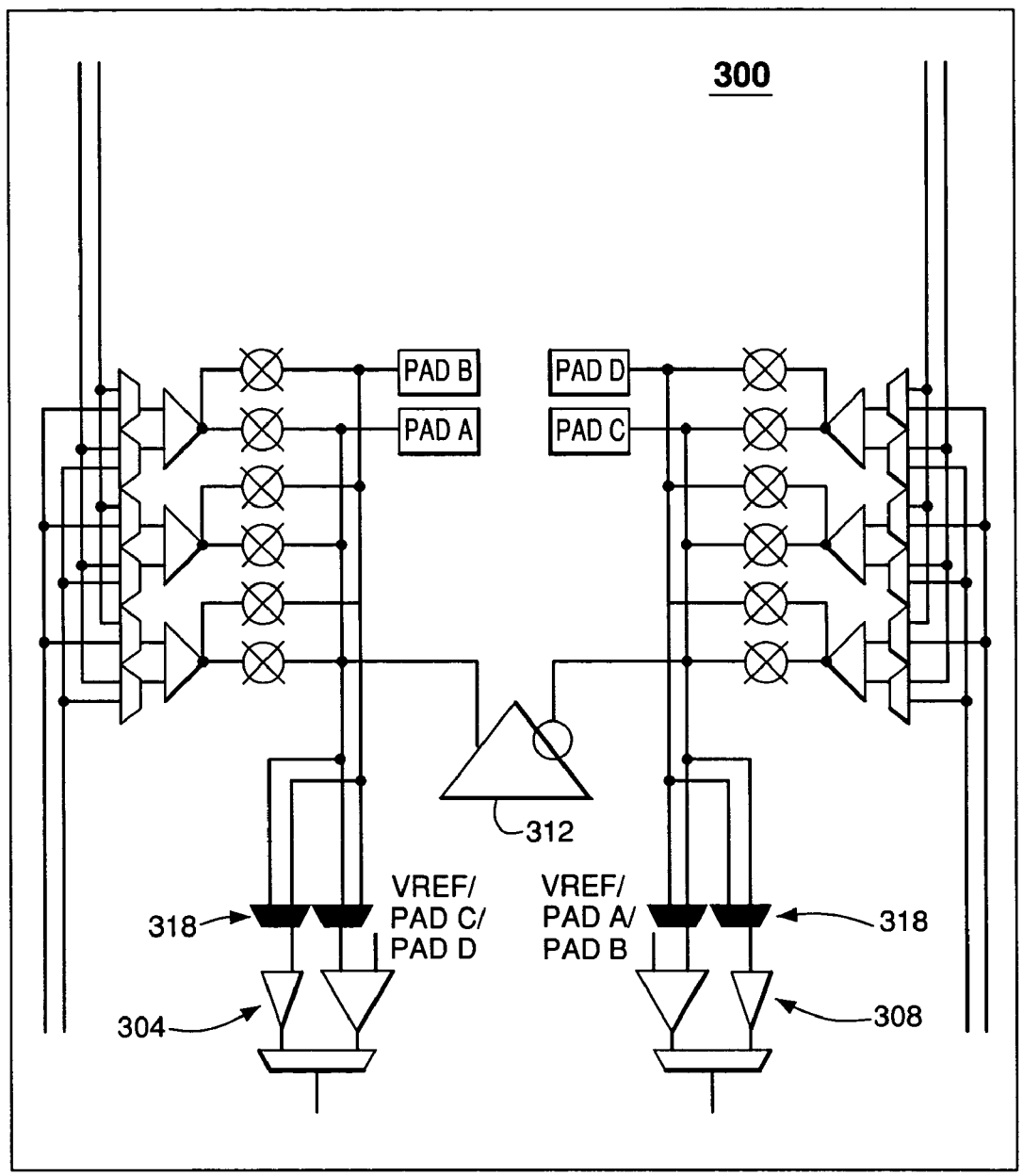

FIG. 3 shows a schematic diagram of a PIB 300 for FPGA 100 of FIG. 1, according to another embodiment of the present invention. PIB 300 is similar to PIB 200 of FIG. 2, except that, instead of having a unique input receiver for each pad, PIB 300 has shared input receivers. In particular, input receiver 304 is connected to receive an incoming signal from either pad A or pad B. Similarly, input receiver 308 is connected to receive an incoming signal from either pad C or pad D. The selection of which pad drives the input receiver is provided by muxes 318. PIB 300 of FIG. 3 may be able to be implemented in a smaller area than PIB 200 of FIG. 2, albeit with reduced functional capabilities.

Figure 4:
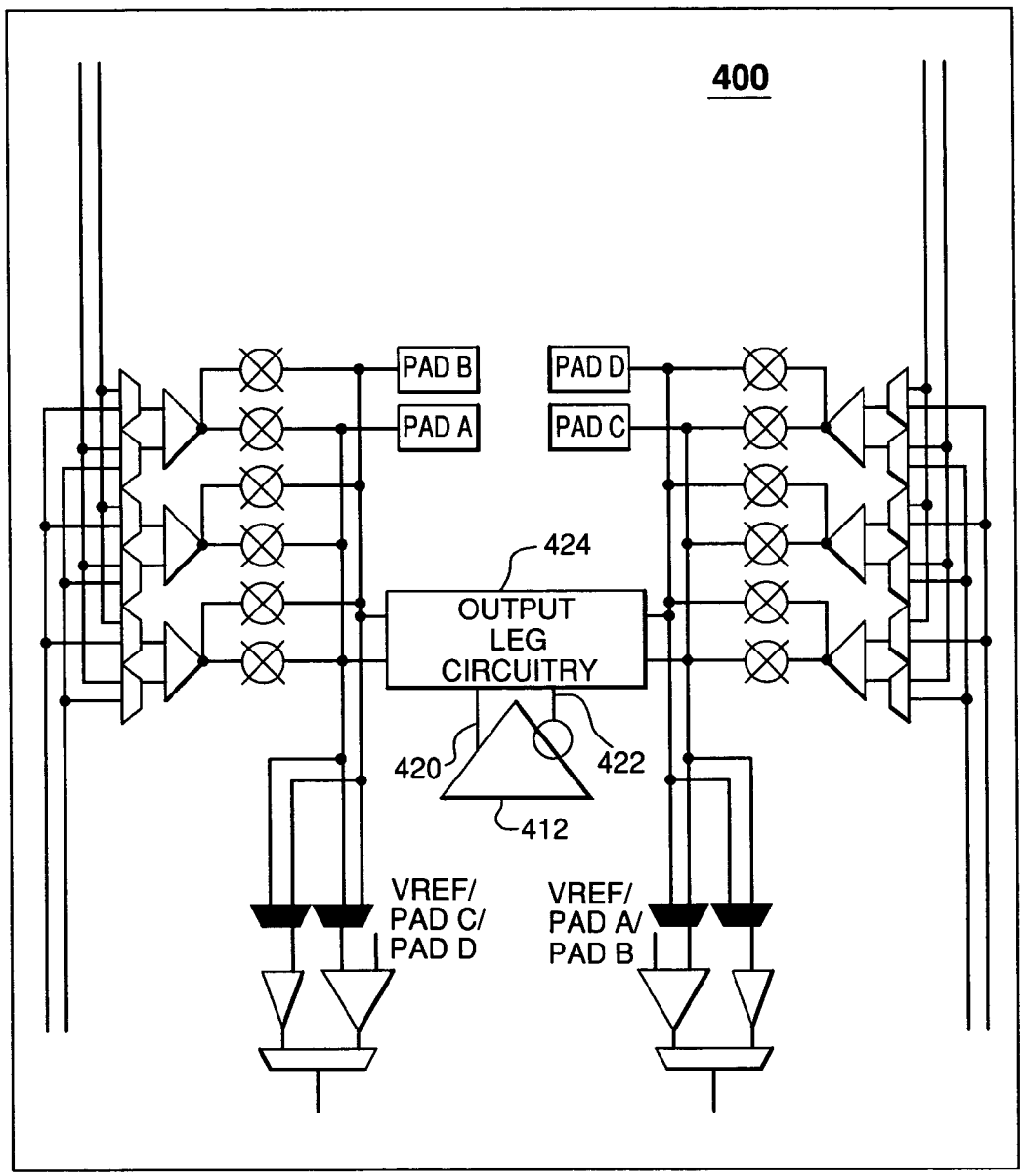

FIG. 4 shows a schematic diagram of a PIB 400 for FPGA 100 of FIG. 1, according to yet another embodiment of the present invention. PIB 400 is similar to PIB 300 of FIG. 3, except that, unlike differential output buffer 312 of FIG. 3, which drives output pads A and C with the two legs of a differential output signal, positive and negative outputs 420 and 422 of differential output buffer 412 apply the two legs of a differential output signal to output leg circuitry 424. Circuitry 424 enables the two legs of the differential output signal to be selectively applied either to pads A and C, respectively, or to pads B and D, respectively.

In one implementation, the selection of either pad pair A/C or pad pair B/D is mutually exclusive, such that PIB 400 supports three different operating modes for differential output buffer 412: a first mode in which pad pair A/C is driven, a second mode in which pad pair B/D is driven, and a third mode in which neither pad pair is driven (e.g., when buffer 412 is turned off). Note that this mutual exclusivity is not necessary for all implementations. Such "non-exclusive" implementations may support a fourth operating mode in which both pad pairs are driven at the same time with a single differential output signal from buffer 412. Furthermore, in alternative embodiments, the PIB could have two differential output buffers, where each buffer drives a different pad pair.

The "mutually exclusive" implementation can be used to enable the FPGA design to support both flip-chip and wire-bond packaging configurations in an efficient manner. Prior-art FPGA designs that support both flip-chip and wire-bond packaging configurations have differential output buffers in which each differential output leg has a single metallic structure that can support either a flip-chip bond or a wire bond. If the FPGA is packaged in a flip-chip configuration, then that portion of the metallic output leg structure strictly corresponding to the wire bond would essentially be unused. Similarly, if the FPGA is packaged in a wire-bond configuration, then that portion of the metallic output leg structure strictly corresponding to the flip-chip bond would essentially be unused. Although this prior-art solution supports both packaging configurations, the excess (i.e., unused) portions of the metallic output leg structures add undesirable capacitance at the output pads.

The principles of PIB 400 can be employed to support either flip-chip or wire-bond packaging configurations by using output leg circuitry 424 to drive, in a mutually exclusive manner, either pad pair A/C (e.g., associated with a flip-chip configuration) or pad pair B/D (e.g., associated with a wire-bond configuration), where each metallic structure connecting one of the two differential buffer outputs with a particular pad is designed to minimize capacitive loading at the pad. In particular, when output leg circuitry 424 is configured to drive one of the pad pairs, capacitance from the other pad pair is shielded from the selected pad pair, and vice versa.

Figure 5:
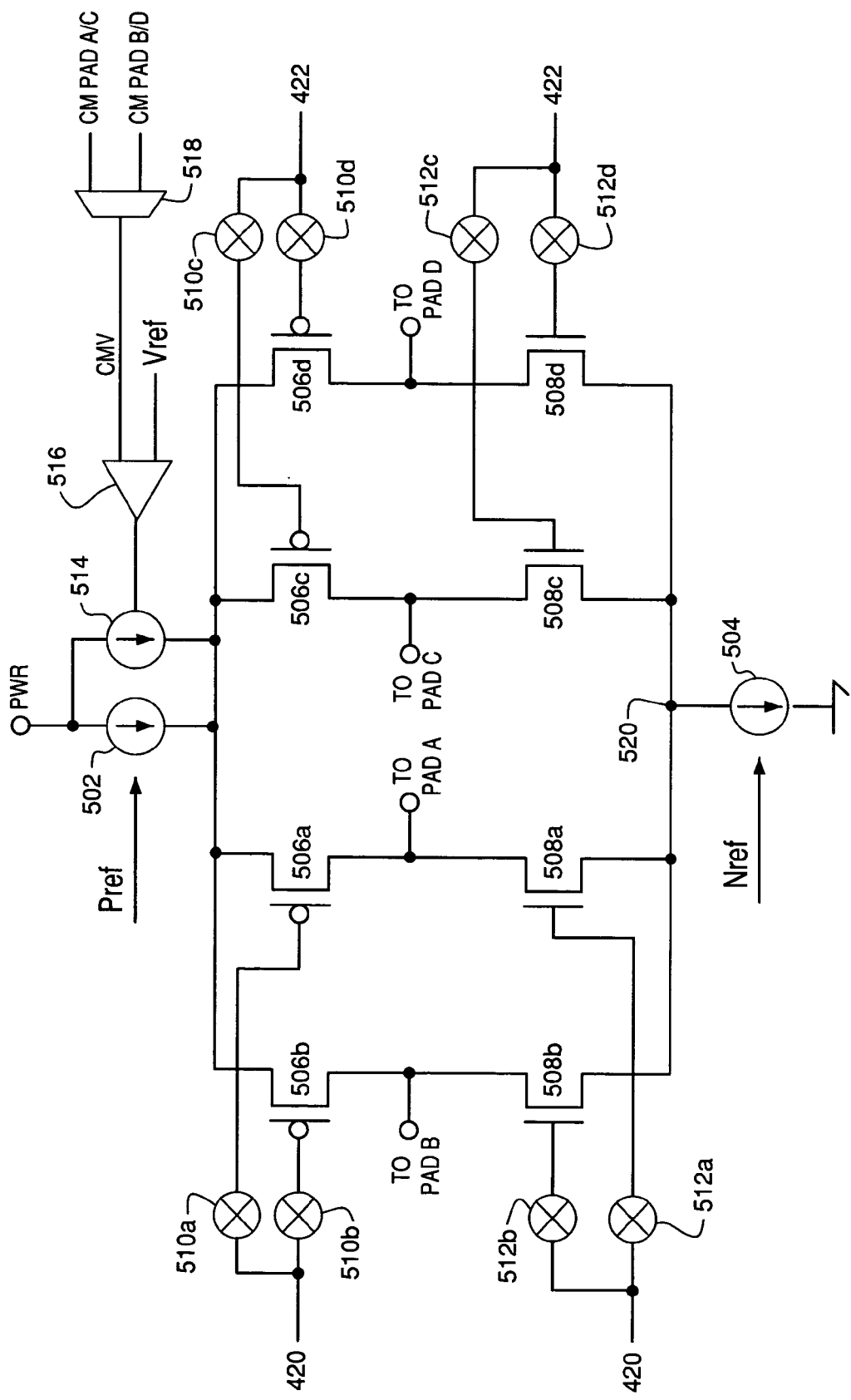
FIG. 5 shows a schematic diagram of output leg circuitry for the PIB of FIG. 4, according to one embodiment of the present invention.

FIG. 5 shows a schematic diagram of output leg circuitry 424 according to one embodiment of the present invention. As shown in FIG. 5, output leg circuitry 424 has a positive current source 502 and a negative current source 504 separated by a configuration of transistors 506, 508 and switches 510, 512. For example, switch 510a is connected to the gate of transistor 506a, and switch 512a is connected to the gate of switch 508a, while switch 510b is connected to the gate of transistor 506b, and switch 512b is connected to the gate of switch 508b. And analogously for transistors 506c–d, 508c–d and switches 510c–d, 512c–d. The node connecting transistors 506a and 508a is also connected to pad A, while the node connecting transistors 506b and 508b is connected to pad B. Similarly, the node connecting transistors 506c and 508c is connected to pad C, while the node connecting transistors 506d and 508d is connected to pad D.

With switches 510a, 512a, 510c, and 512c closed and switches 510b, 512b, 510d, and 512d open, signals corresponding to the two differential legs 420, 422 of a differential output signal from differential output buffer 412 of FIG. 4 will be presented at pads A and C, respectively. Similarly, with switches 510a, 512a, 510c, and 512c open and switches 510b, 512b, 510d, and 512d closed, signals corresponding to the two differential legs 420, 422 will be presented at pads B and D, respectively.

In a preferred implementation, output leg circuitry 424 also includes a second (optional) positive current source 514 configured in parallel with positive current source 502. Current source 514 is controlled by op amp 516 which is differentially driven by common-mode voltage CMV and an appropriate reference voltage Vref. Mux 518 selects the appropriate common-mode voltage to apply to op amp 516. In particular, when switches 510, 512 are configured to drive pads A/C, mux 518 is configured to select the common-mode voltage between pad A and pad C. Alternatively, when switches 510, 512 are configured to drive pads B/D, mux 518 is configured to select the common-mode voltage between pad B and pad D.

Operationally, current source 514 compensates for variations in the common-mode voltage by driving the output leg circuitry to keep the selected common-mode voltage equal to the reference voltage Vref. In alternative implementations, an analogous additional current source could be added in parallel with negative current source 504, either in addition to or instead of current source 514.

Although not shown in the figures, those skilled in the art will understand that pad A and pad C are separated by a series combination of two substantially equal resistors R, where the common-mode voltage between pads A and C is the voltage at the node connecting the two resistors. Similarly, pad B and pad D are separated by a series combination of two substantially equal resistors R, where the common-mode voltage between pads B and D is the voltage at the node connecting the two resistors. The value of each resistor R is preferably substantially larger (e.g., five times) than the external termination applied between each pad pair.

Note that, in PIB 400, output leg circuitry 424 enables two different pairs of pads to be selectively driven with a differential output signal generated by an otherwise shared output buffer. In particular, no matter which output pad pair is selected, the same reference circuitry (which generates reference voltages Vref, Pref, and Nref) and pre-drive circuitry (represented collectively in FIG. 4 by buffer 412) are used to generate the signals on lines 420 and 422, without any performance impact. Note, further, that relatively high capacitance at node 520 improves performance by absorbing jitter in the current, thereby compensating for instability in current source 504.

Although PIB 400 and output leg circuitry 424 support two different pairs of pads, the principles of this circuitry can be extended to any number of pad pairs by providing additional sets of drive leg circuitry similar to that shown in FIG. 5. PIB 400 has differential output buffer 412, which may be suitable for low-voltage differential signaling (LVDS) applications. The present invention can also be implemented in the context of a PIB having one or more output buffers of other types, either in addition to or instead of a differential output buffer, where each of the output buffers is able to drive different pairs of pads.

Figure 6:
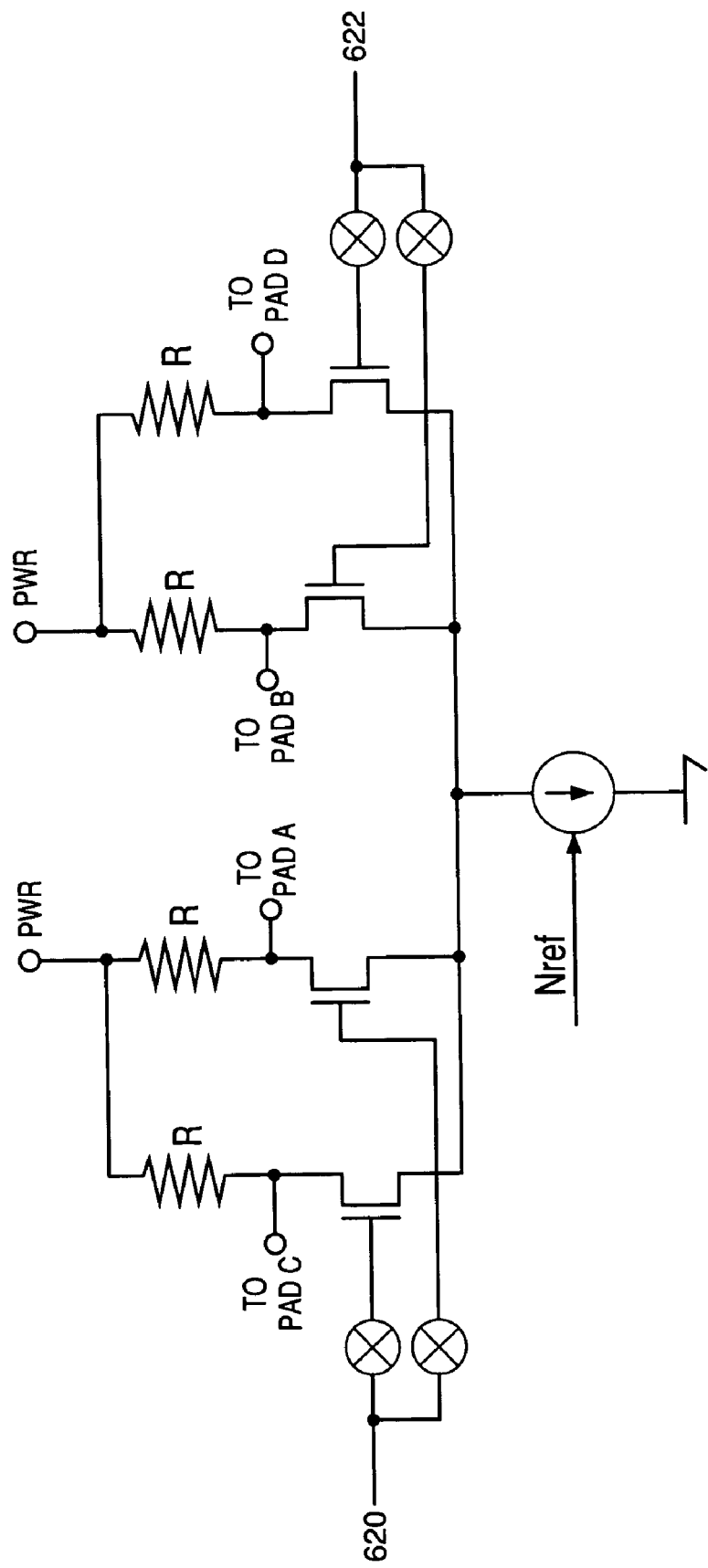
FIG. 6 shows a schematic diagram of output leg circuitry that can be used to support a PIB having a current-mode logic (CML) output buffer for serial/deserial (SerDes) type applications.

FIG. 6 shows a schematic diagram of output leg circuitry 600 that can be used to support a current-mode logic (CML) output buffer for serial/deserial (SerDes) type applications. In one embodiment, output leg circuitry 600 replaces output leg circuitry 424 of FIG. 4, when the PIB has a CML output buffer in place of differential output buffer 412. In another embodiment, the PIB has a CML output buffer in addition to differential output buffer 412, where output leg circuitry 600 is associated with the CML output buffer and each buffer is capable of driving either pad pair. Like output leg circuitry 424, circuitry 600 has switches, transistors, and resistors that enable the CML output buffer to selectively drive either pad pair A/C or pad pair B/D based on a differential signal 620, 622 received from pre-drive circuitry of the CML output buffer.

As with output leg circuitry 424 of FIG. 4, the principles of output leg circuitry 600 can be expanded to support one or more additional pad pairs by adding one or more additional sets of output leg circuitry. Moreover, like output leg circuitry 424, the principles of output leg circuitry 600 can be used to provide FPGA designs that efficiently support both flip-chip and wire-bond packaging configurations. The principles of output leg circuits 424 and 600 can be extended to any other suitable type of output buffer.

Transmission Gates

In addition to supporting the selective driving of different pads, the transmission gates provide another benefit of reducing capacitive load at the pads. For example, referring to FIG. 2, if output buffer 202a is not used to drive either of pads A or B, setting both transmission gates 214a and 216a to their open state, reduces the capacitive load that appears at pads A and B that would otherwise be contributed by the circuitry of output buffer 202a. This reduction in capacitive load may be significant, especially when the I/O buffers are configured for high-speed signaling applications.

Figure 7:
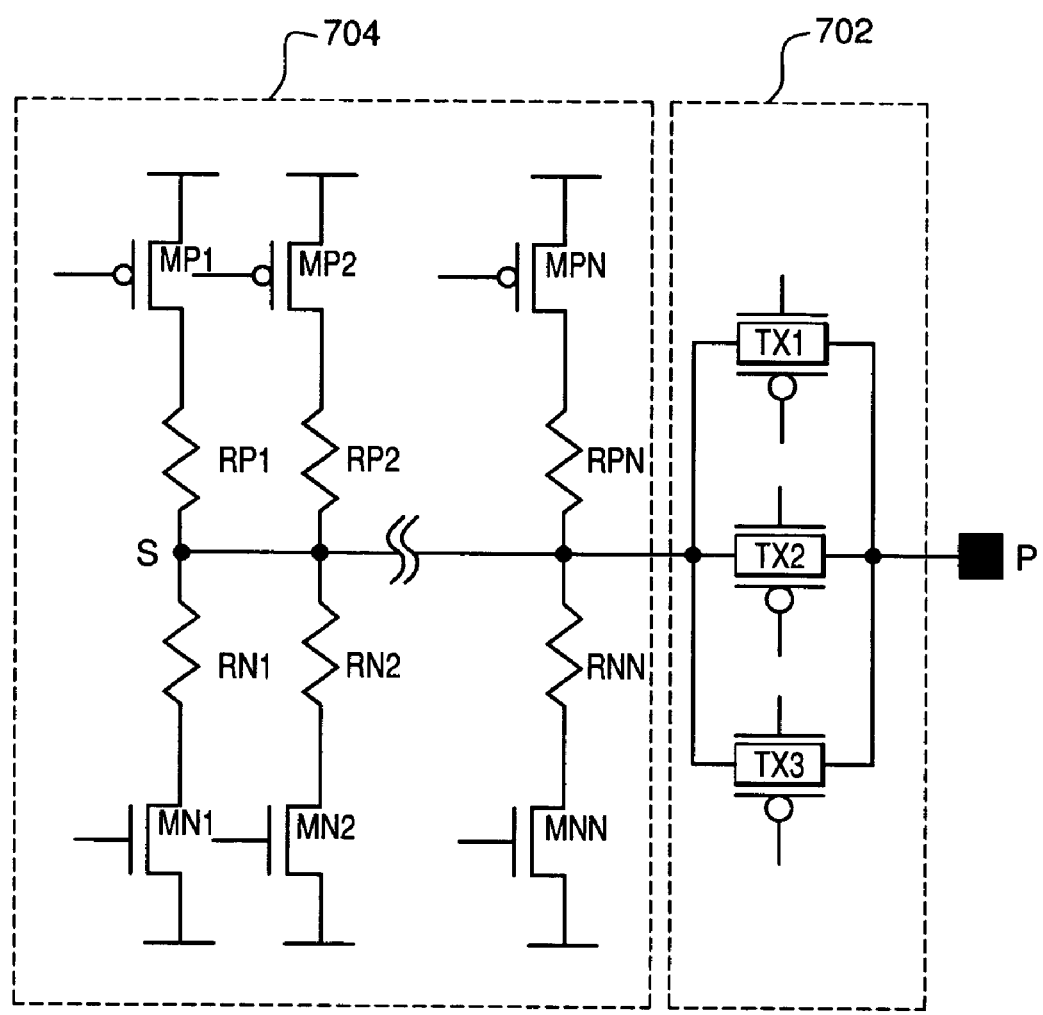
FIG. 7 shows a schematic diagram of a transmission gate connected between the output of a push-pull buffer and a pad, such as may be used in any of the PIBs of FIGS. 2–4.

FIG. 7 shows a schematic diagram of a transmission gate 702 connected between the output of a push-pull buffer 704 and a pad P, such as may be used in any of the PIBs of FIGS. 2–4. In particular, push-pull buffer 704 comprises N push-pull "sub-buffers" connected in parallel, each sub-buffer i comprising (1) a resistor RPi connected between a negatively driven transistor MPi and a shared node S of buffer 704 and (2) a resistor RNi connected between a positively driven transistor MNi and shared node S.

The resistors improve the linearity of the output impedance of buffer 704 as a function of pad voltage and also provide impedance matching with the board impedance. Transmission gate 702 isolates the parasitic capacitance of the resistors from pad P. Without transmission gate 702, the pad capacitance would increase significantly due to the parasitic capacitance of the resistors, which would degrade the performance of high-speed buffers, such as differential output buffer 212 of FIG. 2.

Transmission gate 702 comprises three switch devices TX1–3 connected in parallel between push-pull buffer 704 and pad P. In particular, one side of the channel of each switch device is connected to node S and the other channel side is connected to pad P. Turning off each switch device will place transmission gate 702 in an open (i.e., off) state, in which a signal from transmission gate 702 is not presented at pad P. On the other hand, turning on any one or more of the switch devices will place transmission gate 702 in a closed (i.e., on) state in which a signal from transmission gate 702 is presented at pad P.

Although switch devices TX 1–3 isolate parasitic capacitance of the resistors from pad P, their sizes are preferably optimized to meet the relevant I/O specification of push-pull output buffer 704 across all process, voltage, and temperature corners. At the same time, their junction capacitances are preferably small. To meet these goals, the size of the transmission gates are optimized such that their junction capacitances are small and the resistances are about 20–30% of the resistance of the n-well or poly resistors. In addition, three different control signals (and their complements) are used to enable one or more of transmission gates TX1–3 to compensate for variation of their own resistance due to process and temperature variations. Note that, while process variations are static, temperature variations may be dynamic, in which case the selection of the control signals for the different transmission gates can preferably be changed as needed as temperature changes.

In one possible implementation, if transmission gate 702 is not implemented, the total area of the resistors in push-pull buffer 704 is about (63 microns×63 microns) or about 4000 microns$^2$. In current deep sub-micron technology, the area junction capacitance $C_J$ is about $1×10^{-3}$ farads/meter$^2$ and side-wall capacitance $C_{SW}$ is about $1.2×10^{-10}$ farads/meter. Thus, the total capacitance $C_{RES}$ seen by pad P will be:

$$C_{RES} = (4000\ \mu m^2 \times 1e\text{-}3\ f/m^2) + (4 \times 63\ \mu m \times 1.2e\text{-}10\ f/m)$$

$$= 4\ pf + 0.03\ pf$$

$$= 4.03\ pf$$

When transmission gate 702 is implemented to provide isolation between single-ended buffer 704 and a differential output buffer, such as differential output buffer 212 of FIG. 2, pad P will be exposed to the junction capacitance of transmission gate 702 rather than the capacitance $C_{RES}$ of buffer 704. Transmission gate 702 can be sized to contribute about 20–30% or more of the resistance of n-well or poly resistors and still maintain sufficient linearity of the resistance. In one implementation, the total transmission gate size is about 5×(120+60) or 900 microns. The total capacitance $C_{TGATE}$ seen by pad P will then be:

$$C_{TGATE} = (900\ \mu m \times 1.95\ \mu m \times 1e\text{-}3\ f/m^2) + (2 \times (1.95\ \mu m + 900\ \mu m) \times 1.2e\text{-}10\ f/m)$$

$$= 1.76\ pf + 0.22\ pf$$

$$= 1.98\ pf$$

where 1.95 microns is the window-to-edge distance in output transistors. This corresponds to about a 51% reduction in capacitance seen at pad P by incorporating transmission gate 702.

Although transmission gate 702 of FIG. 7 is implemented using three switch devices connected in parallel, in theory, transmission gates of the present invention can be implemented using any suitable number of one or more switch devices.

Note that, as used in this specification, the terms "switch" and "switch device" are not necessarily equivalent. For example, transmission gate 702 is an example of a type of switch that is itself implemented using three different switch devices.

Although the PIBs of the present invention have been described in the context of implementations having push-pull output buffers, it will be understood that other types of single-ended output buffers could alternatively be used.

Although, for example, PIB 200 of FIG. 2 is implemented with two sets of three output buffers 202, in general, PIBs according to the present invention may be implemented with any suitable number of one or more output buffers in each set. Similarly, although PIB 200 is implemented as being associated with four pads, in general, PIBs according to the present invention may be implemented with any suitable number of pads. Furthermore, PIBs of the present invention may be implemented without a differential output buffer, such as buffer 212 of FIG. 2. In that case, the left and right sides of the circuitry shown in FIG. 2 could be considered to form two different PIBs, each corresponding to a different pair of pads. Moreover, in theory, PIBs could be implemented without input receivers and/or without push-pull output buffers. It will also be understood that the capacitance-reducing advantage of using a transmission gate will still apply if a given output buffer is capable of driving only a single pad, where a transmission gate is implemented between that output buffer and that pad.

Although the present invention has been described in the context of FPGAs, those skilled in the art will understand that the present invention can be implemented in the context of other types of programmable devices, such as, without limitation, programmable logic devices (PLDs) and mask-programmable gate arrays (MPGAs).

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

We claim:

1. A programmable device having programmable input/output (I/O) circuitry and programmable logic connected to receive incoming signals from and provide outgoing signals to the I/O circuitry, the programmable device comprising:
   a first pad and a second pad; and
   a programmable I/O circuit (PIC) associated with the first and second pad, wherein the PIC comprises:
      a first output buffer adapted to present a first outgoing signal at the first pad and adapted to present the first outgoing signal at the second pad; and a first switch connected between the first pad and the first output buffer to selectively present the first outgoing signal at the first pad; and a second switch connected between the second pad and the first output buffer to selectively present the first outgoing signal at the second pad.

2. The invention of claim 1, wherein:

the first switch is a first transmission gate;

the first transmission gate is adapted to be closed when the first output buffer is selected to present the first outgoing signal at the first pad; and the first transmission gate is adapted to be open when the first output buffer is selected not to present the first outgoing signal at the first pad, wherein capacitive loading at the first pad due to the first output buffer is lower when the first transmission gate is open than when the first transmission gate is closed.

3. The invention of claim 1, wherein the first and second switches are individually controllable.

4. The invention of claim 1, wherein the first output buffer is a single-ended output buffer.

5. The invention of claim 1, wherein the PIC further comprises:

one or more other output buffers, each adapted to present an other outgoing signal at the first pad and the second pad; and for each other output buffer:

a first other switch connected between the first pad and the corresponding other output buffer to selectively present the corresponding other outgoing signal at the first pad; and a second other switch connected between the second pad and the corresponding other output buffer to selectively present the corresponding other outgoing signal at the second pad.

6. The invention of claim 1, wherein:

the device further comprises third and fourth pads associated with the PIC; and the first output buffer is a double-ended output buffer adapted to present a two-leg output signal at the first and third pads.

7. The invention of claim 6, wherein the double-ended output buffer is a differential output buffer and the two-leg output signal is a differential output signal.

8. The invention of claim 6, wherein the double-ended output buffer is a current-mode logic (CML) output buffer and the two-leg output signal is a CML output signal.

9. The invention of claim 6, wherein the PIC further comprises output leg circuitry connected to the two outputs of the double-ended output buffer and adapted to selectively present the two-leg output signal either at the first and third pads or at the second and fourth pads.

10. The invention of claim 9, wherein the selection of the first and third pads is mutually exclusive of the selection of the second and fourth pads.

11. The invention of claim 9, wherein the first and third pads are associated with a flip-chip configuration, and the second and fourth pads are associated with a wire-bond configuration.

12. The invention of claim 9, wherein the output leg circuitry enables both pairs of pads to share pre-drive and reference circuitry of the double-ended output buffer.

13. The invention of claim 9, wherein the output leg circuitry comprises compensation circuitry to compensate for variations in common-mode voltage between the selected pair of pads.

14. The invention of claim 9, wherein capacitance associated with the first and third pads is shielded from the second and fourth pads, and vice versa.

15. The invention of claim 1, wherein the PIC further comprises:

a first input receiver adapted to receive a first incoming signal from the first pad; and a second input receiver adapted to receive a second incoming signal from the second pad.

16. The invention of claim 1, wherein the PIC further comprises a first input receiver adapted to selectively receive a first incoming signal from the first pad and a second incoming signal from the second pad.

17. The invention of claim 16, wherein the PIC further comprises one or more muxes connected between the first input receiver and the first and second pads to control the selection of the first and second incoming signals for receipt by the first input receiver.

18. The invention of claim 1, wherein:

the programmable device is an FPGA;

the first switch is a first transmission gate;

the first transmission gate is adapted to be closed when the first output buffer is selected to present the first outgoing signal at the first pad;

the first transmission gate is adapted to be open when the first output buffer is selected not to present the first outgoing signal at the first pad, wherein capacitive loading at the first pad due to the first output buffer is lower when the first transmission gate is open than when the first transmission gate is closed;

the first and second switches are individually controllable;

the first output buffer is a single-ended output buffer;

the device further comprises third and fourth pads associated with the PIC; and the PIC further comprises:

one or more other output buffers, each adapted to present an other outgoing signal at the first pad and the second pad; and for each other output buffer:

a first other switch connected between the first pad and the corresponding other output buffer to selectively present the corresponding other outgoing signal at the first pad; and a second other switch connected between the second pad and the corresponding other output buffer to selectively present the corresponding other outgoing signal at the second pad;

a double-ended output buffer; and output leg circuitry connected to the two outputs of the double-ended output buffer and adapted to selectively present the two-leg output signal either at the first and third pads or at the second and fourth pads, wherein:

the selection of the first and third pads is mutually exclusive of the selection of the second and fourth pads;

the first and third pads are associated with a flip-chip configuration, and the second and fourth pads are associated with a wire-bond configuration;

the output leg circuitry enables both pairs of pads to share pre-drive and reference circuitry of the double-ended output buffer;

the output leg circuitry comprises compensation circuitry to compensate for variations in common-mode voltage between the selected pair of pads; and capacitance associated with the first and third pads is shielded from the second and fourth pads, and vice versa.

19. A programmable device having programmable input/output (I/O) circuitry and programmable logic connected to receive incoming signals from and provide outgoing signals to the I/O circuitry, the programmable device comprising:
   at least four pads;
   a programmable I/O circuit (PIC) associated with the four pads, wherein the PIC comprises:
      a first plurality of single-ended output buffers, each adapted to present a single-ended output signal at first and second output pads;
      a second plurality of single-ended output buffers, each adapted to present a single-ended output signal at third and fourth output pads; and
      at least one double-ended output buffer adapted to present a two-leg output signal at the first and third pads; and
      two or more input receivers adapted to receive input signals from the four pads.

20. The invention of claim 19, wherein the double-ended output buffer is a differential output buffer.

21. The invention of claim 19, wherein the double-ended output buffer is a CML output buffer.

22. The invention of claim 19, wherein the double-ended output buffer is further adapted to selectively present the two-leg output signal at the second and fourth pads.

23. The invention of claim 22, wherein the selection of the first and third pads or the second and fourth pads is mutually exclusive.

24. The invention of claim 19, wherein the two or more input receivers comprise four input receivers, each adapted to receive an input signal from a different one of the four pads.

25. The invention of claim 19, wherein:
   a first input receiver is adapted to receive input signals from both the first and second pads; and
   a second input receiver is adapted to receive input signals from both the third and fourth pads.

26. A programmable device having programmable input/output (I/O) circuitry and programmable logic connected to receive incoming signals from and provide outgoing signals to the I/O circuitry, the programmable device comprising:
   at least four pads; and
   a double-ended output buffer adapted to selectively present a two-leg outgoing signal at first and third pads and adapted to selectively present the two-leg outgoing signal at second and fourth pads, wherein the selection of the first and third pads or the second and fourth pads is mutually exclusive.

27. The invention of claim 26, wherein the double-ended output buffer is a differential output buffer.

28. The invention of claim 26, wherein the double-ended output buffer is a CML output buffer.

29. The invention of claim 26, wherein the PIC further comprises output leg circuitry connected to the two outputs of the double-ended output buffer and adapted to selectively present the two-leg output signal either at the first and third pads or at the second and fourth pads.

30. The invention of claim 29, wherein the output leg circuitry enables both pairs of pads to share pre-drive and reference circuitry of the double-ended output buffer.

31. The invention of claim 29, wherein the output leg circuitry comprises compensation circuitry to compensate for variations in common-mode voltage between the selected pair of pads.

32. The invention of claim 26, wherein the first and third pads are associated with a flip-chip configuration, and the second and fourth pads are associated with a wire-bond configuration.

33. The invention of claim 26, wherein capacitance associated with the first and third pads is shielded from the second and fourth pads, and vice versa.

34. A programmable device having programmable input/output (I/O) circuitry and programmable logic connected to receive incoming signals from and provide outgoing signals to the I/O circuitry, the programmable device comprising:
   a first pad and a second pad; and
   a programmable I/O circuit (PIC) associated with the first pad and the second pad, wherein the PIC comprises:
      a first output buffer adapted to present a first outgoing signal at the first pad;
      a first switch connected between the first pad and the first output buffer to selectively present the first outgoing signal at the first pad;
      a second output buffer adapted to present a second outgoing signal at the first pad; and
      a second switch connected between the first pad and the second output buffer to selectively present the second outgoing signal at the first pad, wherein at least one of the first and second output buffers is further adapted to present its outgoing signal at the second pad.

* * * * *